United States Patent
Prasad et al.

(10) Patent No.: US 10,396,769 B2
(45) Date of Patent: Aug. 27, 2019

(54) APPARATUS AND METHOD FOR CLOCK SIGNAL FREQUENCY DIVISION USING SELF-RESETTING, LOW POWER, LINEAR FEEDBACK SHIFT REGISTER (LFSR)

(71) Applicant: QUALCOMM Incorporated, San Diego, CA (US)

(72) Inventors: Mangal Prasad, Raleigh, NC (US); Victor Git-Han Moy, Durham, NC (US); Xiaobin Yuan, Cary, NC (US); Anirban Banerjee, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/786,976

(22) Filed: Oct. 18, 2017

(65) Prior Publication Data

US 2019/0115908 A1    Apr. 18, 2019

(51) Int. Cl.
*H03K 5/26* (2006.01)
*H03K 19/20* (2006.01)
*H03K 3/037* (2006.01)
*H03K 23/54* (2006.01)
*H03K 3/3562* (2006.01)

(52) U.S. Cl.
CPC .............. *H03K 5/26* (2013.01); *H03K 3/0372* (2013.01); *H03K 19/20* (2013.01); *H03K 23/54* (2013.01); *H03K 3/35625* (2013.01)

(58) Field of Classification Search
CPC ......... H03K 5/26; H03K 19/20; H03K 3/0372
See application file for complete search history.

(56) References Cited

U.S. PATENT DOCUMENTS

| 4,320,510 | A | * | 3/1982 | Kojima | G11B 20/1813 714/755 |
| 5,347,523 | A | | 9/1994 | Khatri et al. | |
| 5,542,051 | A | * | 7/1996 | Sugita | G06F 11/0757 714/51 |
| 5,608,897 | A | | 3/1997 | Claffey-Cohen et al. | |
| 5,682,474 | A | * | 10/1997 | Hsu | A63F 13/00 726/29 |
| 5,694,444 | A | * | 12/1997 | Bagchi | G01R 31/318527 377/20 |

(Continued)

*Primary Examiner* — Thomas J. Hiltunen
(74) *Attorney, Agent, or Firm* — Loza & Loza, LLP/Qualcomm

(57) ABSTRACT

Various clock frequency dividers are disclosed. Each frequency divider includes cascaded flip-flops and a feedback logic gate. First data inputs of the flip-flops are for propagating logic values along the cascaded flip-flops and the feedback gate for generating valid states of a sequence in response to a clock signal. Each frequency divider includes an invalid state elimination circuit configured to detect an invalid state at the outputs of the flip-flops and change it into a valid state in response to the clock signal. In some implementations, the invalid state elimination circuit includes a NOR gate to detect an all-zero invalid state and generate a control signal to cause the flip-flops to output logic values associated with a valid state or to cause a multiplexer to introduce a logic value associated with a valid state. In other implementations, the invalid state elimination circuit instead includes an AND gate to detect an all-ones invalid state.

24 Claims, 7 Drawing Sheets

(56) References Cited

U.S. PATENT DOCUMENTS

| | | | |
|---|---|---|---|
| 6,014,408 A * | 1/2000 | Naruse | H03K 3/84 |
| | | | 341/187 |
| 6,057,719 A | 5/2000 | Austin et al. | |
| 6,424,691 B1 | 7/2002 | Neravetla et al. | |
| 6,556,647 B1 | 4/2003 | Neravetla | |
| 6,654,439 B1 | 11/2003 | Kommrusch | |
| 6,961,403 B1 * | 11/2005 | Austin | G11C 19/00 |
| | | | 327/115 |
| 7,206,797 B2 * | 4/2007 | Gressel | G06F 7/582 |
| | | | 708/250 |
| 8,525,561 B2 * | 9/2013 | Austin | H03K 23/54 |
| | | | 327/115 |
| 8,976,586 B2 * | 3/2015 | Nagai | G06F 7/58 |
| | | | 365/185.04 |
| 9,495,271 B2 * | 11/2016 | Morrison | G06F 11/3062 |
| 2002/0054681 A1 * | 5/2002 | Kuribayashi | G11B 20/10009 |
| | | | 380/210 |
| 2010/0257429 A1 | 10/2010 | Noguchi | |
| 2011/0133793 A1 * | 6/2011 | Wheelock | H03K 21/38 |
| | | | 327/115 |
| 2014/0053003 A1 | 2/2014 | Moyer et al. | |

* cited by examiner

APPARATUS AND METHOD FOR CLOCK SIGNAL FREQUENCY DIVISION USING SELF-RESETTING, LOW POWER, LINEAR FEEDBACK SHIFT REGISTER (LFSR)

FIELD

Aspects of the present disclosure relate generally to clock signal frequency dividers, and in particular, to an apparatus and method for clock signal frequency division using self-resetting, low power, linear feedback shift register (LFSR).

BACKGROUND

A linear feedback shift register (LFSR) is often used to implement a clock signal frequency divider for various applications, including phase lock loop applications. Such LFSR-based clock frequency dividers include a circuit for detecting an invalid state generated by the LFSR and responsively modify the invalid state so that the LFSR generates a valid state. Additionally, such LFSR-based clock frequency dividers include another circuit for detecting an end-of-sequence state generated by the LFSR.

In the past, both the invalid state detecting circuit and end-of-sequence detecting circuit generate signals for an OR gate, whereby the OR gate responsively generates a signal to initiate the changing of the invalid state to a valid state or setting the LFSR to an initial valid state. The additional OR gate introduces delay that adversely impacts the speed of the LFSR-based clock divider. Other impacts to the speed of the LFSR-based clock divider include delays associated with separate multiplexers coupled between adjacent flip-flops of the LFSR, respectively, in order to introduce the initial valid state into the LFSR. The additional multiplexers and OR gate also have the negative consequence of requiring more integrated circuit (IC) footprint to implement, as requiring more power to operate.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a logic gate; and a set of cascaded flip-flops, wherein each of the flip-flops includes first and second data inputs, a data output, a clock input, and a select input, wherein the first data input of one of the set of cascaded flip-flops is coupled to an output of the first logic gate, wherein at least two data outputs of the set of cascaded flip-flops are coupled to at least two inputs of the first logic gate, respectively, wherein the select inputs of the set of cascaded flip-flops are configured to receive a first control signal, and wherein the second data inputs are configured to receive logic values of an initial valid state of a sequence. The set of cascaded flip-flops are configured to: generate distinct valid states of the sequence at their respective data outputs in response to a first clock signal applied to the clock inputs of the set of cascaded flip-flops and the first control signal being deasserted; and generate the initial valid state of the sequence at their respective data outputs in response to the first clock signal and the first control signal being asserted.

Another aspect of the disclosure relates to a method including generating logic values of a set of distinct valid states of a sequence at a set of nodes in response to a first clock signal, respectively; and determining whether the logic values at the set of nodes corresponds to an invalid state; and controlling at least one of a set of cascaded flip-flops or a multiplexer to change at least one of the logic values corresponding to the invalid state to produce logic values corresponding to one of the valid states at the respective nodes in response to the first clock signal.

Another aspect of the disclosure relates to apparatus including means for generating logic values of a set of distinct valid states of a sequence at a set of nodes in response to a first clock signal, respectively; means for determining whether the logic values at the set of nodes corresponds to an invalid state; and means for controlling at least one of a set of cascaded flip-flops or a multiplexer to change at least one of the logic values corresponding to the invalid state to produce logic values corresponding to one of the valid states at the respective nodes in response to the first clock signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
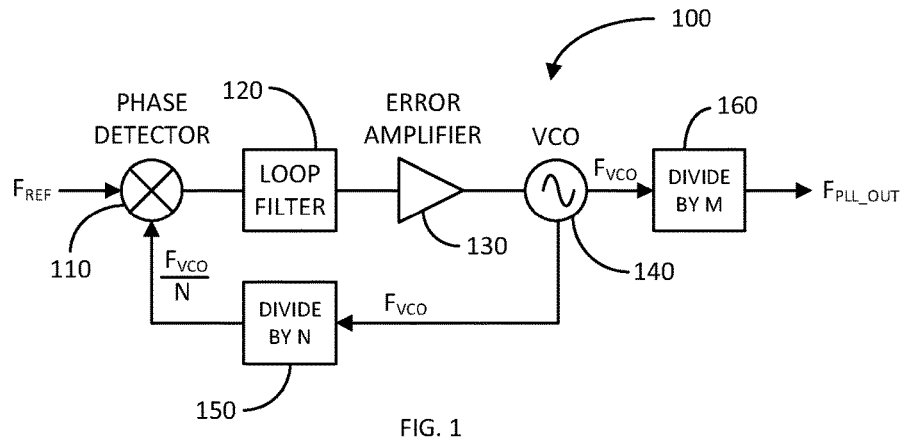
FIG. 1 illustrates a block diagram of an exemplary phase lock loop (PLL) in accordance with an aspect of the disclosure.

FIG. 1 illustrates a block diagram of an exemplary phase lock loop (PLL) 100 in accordance with an aspect of the disclosure. The PLL 100 typically includes a phase detector 110, a loop filter 120, an error amplifier 130, a voltage controlled oscillator (VCO) 140, a divide-by-N clock signal frequency divider 150, and a divide-by-M clock signal frequency divider 160.

The phase detector 110 receives a reference clock (or oscillating) signal $F_{REF}$ and a feedback clock signal $F_{VCO}/N$ from an output of the divide-by-N frequency divider 150. The phase detector 110 generates a phase error signal indicative of a phase difference between the reference clock signal $F_{REF}$ and the feedback clock signal $F_{VCO}/N$. The loop filter 120 and error amplifier 130 integrate the phase error signal to generate a frequency control voltage related to a frequency difference between the reference clock signal $F_{REF}$ and the feedback clock signal $F_{VCO}/N$.

Based on the frequency control voltage, the VCO 140 generates a VCO clock signal $F_{VCO}$. The divide-by-N frequency divider 150 divides the frequency of the VCO clock signal $F_{VCO}$ to generate the feedback clock signal $F_{VCO}/N$. As indicated, the frequency of the feedback clock signal $F_{VCO}/N$ is $1/N^{th}$ the frequency of the VCO clock signal $F_{VCO}$. The frequency control voltage applied to the VCO 140 causes the VCO to generate the VCO clock signal $F_{CVO}$ such that the feedback clock signal $F_{VCO}/N$ is phase and frequency locked with the reference clock signal $F_{REF}$.

The divide-by-M clock signal frequency divider 160 divides the frequency of the VCO clock signal $F_{VCO}$ to generate an output clock signal $F_{PLL\_OUT}$. Similarly, as indicated, the frequency of the PLL output clock signal $F_{PLL\_OUT}$ is $1/M^{th}$ the frequency of the VCO clock signal $F_{VCO}$. As the feedback clock signal $F_{VCO}/N$ is phase and frequency locked to the reference clock signal $F_{REF}$ due to the PLL operation, both the VCO clock signal $F_{VCO}$ and the PLL output clock signal $F_{PLL\_OUT}$ are also phase and frequency locked to the reference clock signal $F_{REF}$. As the reference clock signal $F_{REF}$ may be generated with high frequency stability and low phase noise, these desirable characteristics are present in the PLL output clock signal $F_{PLL\_OUT}$ due to the PLL operation.

The divide-by-N and divide-by-M clock signal frequency dividers 150 and 160 may each be implemented using binary counters. However, binary counters have a disadvantage of requiring a substantial amount of time or delay to perform the frequency division operation. Thus, the frequency at which the PLL may be operated using binary counters is somewhat limited due to the relatively low speed operation of binary counters. Additionally, binary counters typically require substantial amount of integrated circuit (IC) footprint to implement and substantial amount of power to operate.

Accordingly, linear feedback shift register (LFSR) counters are often used for programmable frequency division in PLL applications because of their high speed, low power, and low IC footprint characteristics.

Figure 2:
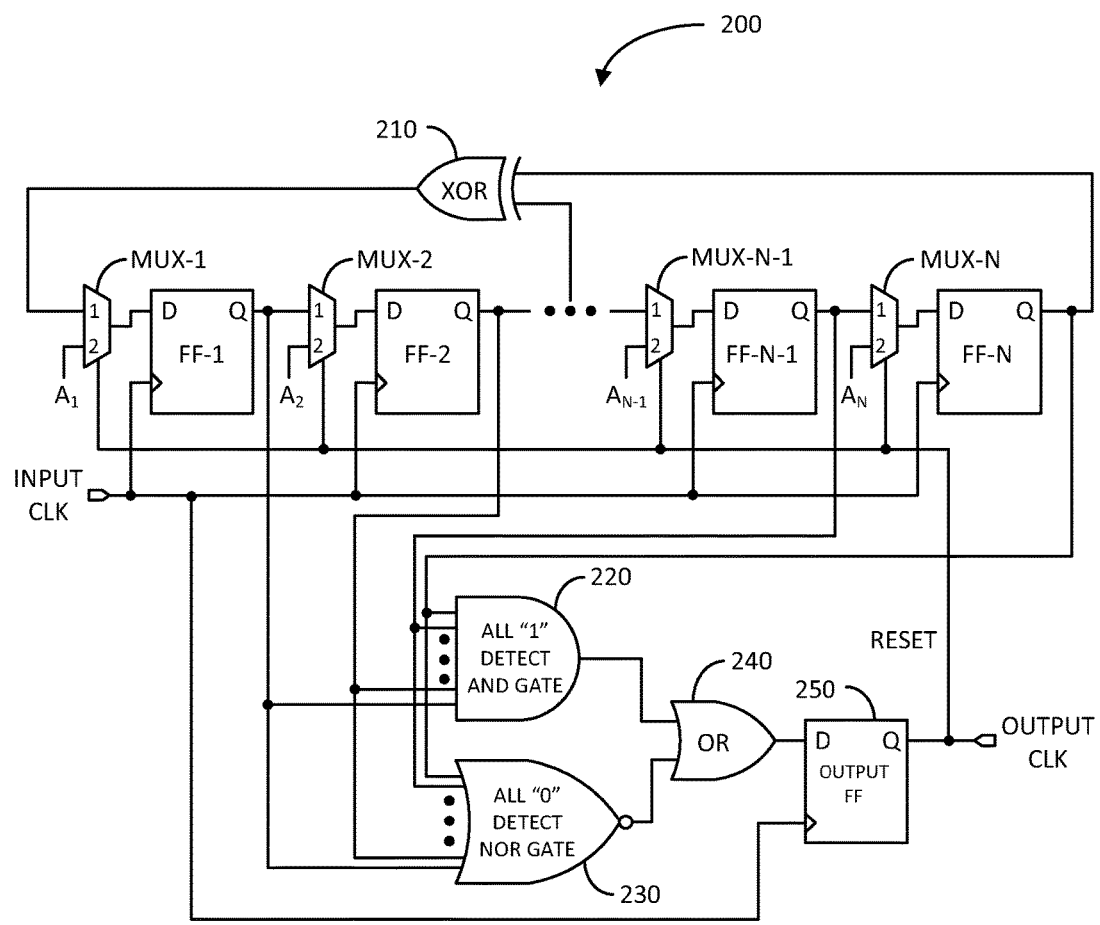
FIG. 2 illustrates a schematic diagram of an exemplary clock signal frequency divider in accordance with another aspect of the disclosure.

FIG. 2 illustrates a schematic diagram of an exemplary clock signal frequency divider 200 in accordance with another aspect of the disclosure. The clock signal frequency divider 200 may be a detailed implementation of an LFSR-based clock frequency divider used in the PLL 100, such as clock signal frequency dividers 150 and 150 previously discussed.

In particular, the clock signal frequency divider 200 includes an LFSR including a set of flip-flops FF-1 to FF-N, an exclusive-OR (XOR) gate 210, and a set of multiplexers MUX-1 to MUX-N. The multiplexers MUX-1 to MUX-N include outputs coupled to data inputs (D) of the flip-flops FF-1 to FF-N, respectively. The multiplexers MUX-2 to MUX-N have first inputs coupled to data outputs (Q) of the flip-flops FF-1 to FF-N–1, respectively. The data output (Q) of the last flip-flop FF-N is coupled to a first input of the XOR gate 210, and the output of the XOR gate 210 is coupled to a data input (D) of the first multiplexer MUX-1.

Depending on the configuration of the LFSR, at least one data output (Q) of another flip-flop is coupled to at least another input of the XOR gate 210, as represented by the connection from the ellipses representing one or more multiplexer-flip-flop pairs to a second input of the XOR gate 210. As an example, if the LFSR is configured as an $x^9+x^5+1$ polynomial LFSR, the data output (Q) of the last flip-flop FF-9 (N=9) is coupled to the first input of the XOR gate 210 and the data output (Q) of the fifth flip-flop FF-5 is coupled to the second input of the XOR gate 210.

Logic values $A_1$ to $A_N$ of a programmable initial valid state of a sequence are applied to the second inputs of the multiplexers MUX-1 to MUX-N, respectively. A RESET signal is applied to select inputs of the multiplexers MUX-1 to MUX-N. If the RESET signal is deasserted (e.g., a low logic voltage), the multiplexers MUX-1 to MUX-N output the signals at their respective first inputs. If the RESET signal is asserted (e.g., a high logic voltage), the multiplexers MUX-1 to MUX-N output the logic values $A_1$ to $A_N$ at their respective second inputs.

An input clock signal is applied to the clock inputs of the flip-flops FF-1 to FF-N. It is the frequency of the input clock signal which the LFSR based frequency divider 200 divides to generate an output clock signal.

The LFSR-based clock signal frequency divider 200 includes an all-zero-detect NOR gate 230 configured to generate an asserted signal (e.g., a high logic voltage) in response to detecting all logic zeros (0s) at the data outputs (Q) of the flip-flops FF-1 to FF-N, respectively. In this example, the all logic "0" state is invalid because the LFSR would continuously shift all logic zeros (0s), and not generate the $2^N-1$ distinct valid states of a sequence during proper operation.

The LFSR-based clock signal frequency divider 200 includes an all-one-detect AND gate 220 configured to generate an asserted signal (e.g., a high logic voltage) in response to detecting all logic ones (1s) at the data outputs (Q) of the flip-flops FF-1 to FF-N, respectively. The all logic "1" state indicates an end state of the sequence.

The outputs of the all-zero-detect NOR gate 230 and the all-one-detect AND gate 220 are coupled to inputs of an OR gate 240. In this configuration, the OR gate 240 generates an asserted signal (e.g., a high logic voltage) when either the all logic "0" state occurs or the all logic "1" state occurs. The output of the OR gate 240 is coupled to a data input (D) of an output flip-flop 250. The input clock signal is also applied to a clock input of the output flip-flop 250. The output flip-flop 250 includes a data output (Q) configured to generate the output clock signal, which also serves as the RESET signal.

The LFSR-based clock signal frequency divider 200 operates as follows: if upon start-up (or other situation) the data outputs (Q) of the flip-flops FF-1 to FF-N are all logic zeros (0s) (e.g., the invalid state), the all-zero-detect NOR gate 230 generates a high logic voltage. In response to this high logic voltage, the OR gate 240 likewise outputs a high logic voltage. In response to this high logic voltage and a rising edge of the input clock signal, the output flip-flop 250 generates a high logic voltage at its data output (Q) to assert the RESET signal. This causes the multiplexers MUX-1 to MUX-N to output the logic values $A_1$ to $A_N$ of the initial state, which is one of the valid states of the $2^N-1$ sequence.

In response to the next rising edge of the input clock signal, the flip-flops FF-1 to FF-N output the initial states $A_1$ to $A_N$, which avoids the invalid all-zero-state and allows the LFSR to sequence through the valid states starting from the initial state $A_1$ to $A_N$ to the all one state. As the flip-flops FF-1 to FF-N are no longer outputting all logic zeros, the all-zero-detect NOR gate 230 outputs a low logic voltage, causing the OR gate 240 to also output a low logic voltage. Thus, in response to the next rising edge of the input clock signal, the output flip-flop 250 outputs a low logic voltage to deassert the RESET signal and reconfigure the multiplexers MUX-1 to MUX-N to output the signals at their respective first inputs. This is how the LFSR-based clock signal frequency divider 200 deals with the invalid state of all logic zeros.

During normal sequencing operation, the LFSR-based clock signal frequency divider 200 generates a sequence starting from the initial state $A_1$ to $A_N$ and ending with the all one state. The sequence is initiated in response to the RESET signal being asserted, which may be in response to the all one state detected by the AND gate 220 signifying completion of a prior sequence. The length of a sequence depends on the initial state $A_1$ to $A_N$. For example, if the initial state $A_1$ to $A_N$ is the first state in the sequence, then the length of the sequence is given by $2^N-1$. If the initial state $A_1$ to $A_N$ is the $J^{th}$ state of the sequence, then the length of the sequence is given by $2^N-J$.

The frequency division ratio of the LFSR-based clock signal frequency divider 200 is the inverse of the length of the sequence, i.e., $1/(2^N-J)$. Thus, by controlling or setting the initial state $A_1$ to $A_N$ (and its $J^{th}$ position in the sequence), the frequency division ratio of the LFSR-based frequency divider 200 may be programmed.

There are several drawbacks of the clock signal frequency divider 200. A first drawback is that the generating of the output clock pulse requires propagation through two sets of gates, the all-one-detect AND gate 220 and the OR gate 240. That is, once the flip-flops FF-1 to FF-N output the all one state, the output flip-flop 250 does not respond to that state until the all one state indication propagates through the all-one-detect AND gate 220 and the OR gate 230. This delay has a significant impact on the maximum frequency at which the frequency divider 200 may operate.

Another drawback of the clock signal frequency divider 200 is the requirement of the multiplexers MUX-1 to MUX-N. These multiplexers each introduce some delay in generating the sequence by the flip-flops FF-1 to FF-N. As such, these mux delays also have a significant impact on the maximum frequency at which the frequency divider 200 may operate. Further, the other drawback stems from the fact that implementing the OR gate 240 and the multiplexers MUX-1 to MUX-N require significant IC footprint and operating these devices consume significant amount of power.

Thus, there is a need to increase the maximum operating frequency of a clock signal frequency divider, as well as to reduce the IC footprint required to implement such divider and the power to operate the divider.

A concept of the disclosure is to eliminate the OR gate 240 from the RESET path so that there is only a single gate (e.g., the all-one-detect AND gate 220) between the flip-flops FF-1 to FF-N and the output flip-flop. This significantly reduces the delay associated with an LFSR-based clock signal frequency divider, allowing the divider to operate at higher frequencies.

Another concept of the disclosure is to couple the output of the all-zero-detect NOR gate to a select input of a single multiplexer MUX between a certain adjacent pair of flip-flops. The single multiplexer MUX includes a first input coupled to the data output (Q) of a previous flip-flop (e.g., flip-flop FF-N-1). The second input of the multiplexer MUX is configured to receive a high logic voltage (e.g., coupled to an upper voltage rail $V_{DD}$). Thus, in response to detecting the invalid all zero state, the single multiplexer outputs the logic one to eliminate the all zero state, allowing the LFSR to output the sequence for normal operations.

Yet another concept of the disclosure is to eliminate the multiplexers for introducing the programmable initial state $A_1$ to $A_N$, and instead, use flip-flops FF-1 to FF-N that include second data inputs (D1) for receiving the initial state logic values $A_1$ to $A_N$, respectively, and a select (SEL) input configured to output the first data inputs (D0) or the second data inputs (D1) in response to a deasserted or asserted state of the RESET signal, respectively. As the separate multiplexers are eliminated from the chain, the LFSR is able to operate at much higher frequencies.

Still another concept of the invention is to provide a frequency divide-by-two flip-flop including a feedback inverter at the data output (Q) of the output flip-flop so that the output clock signal has a 50% duty cycle. Several exemplary implementations employing the aforementioned concepts are described further herein.

Figure 3:
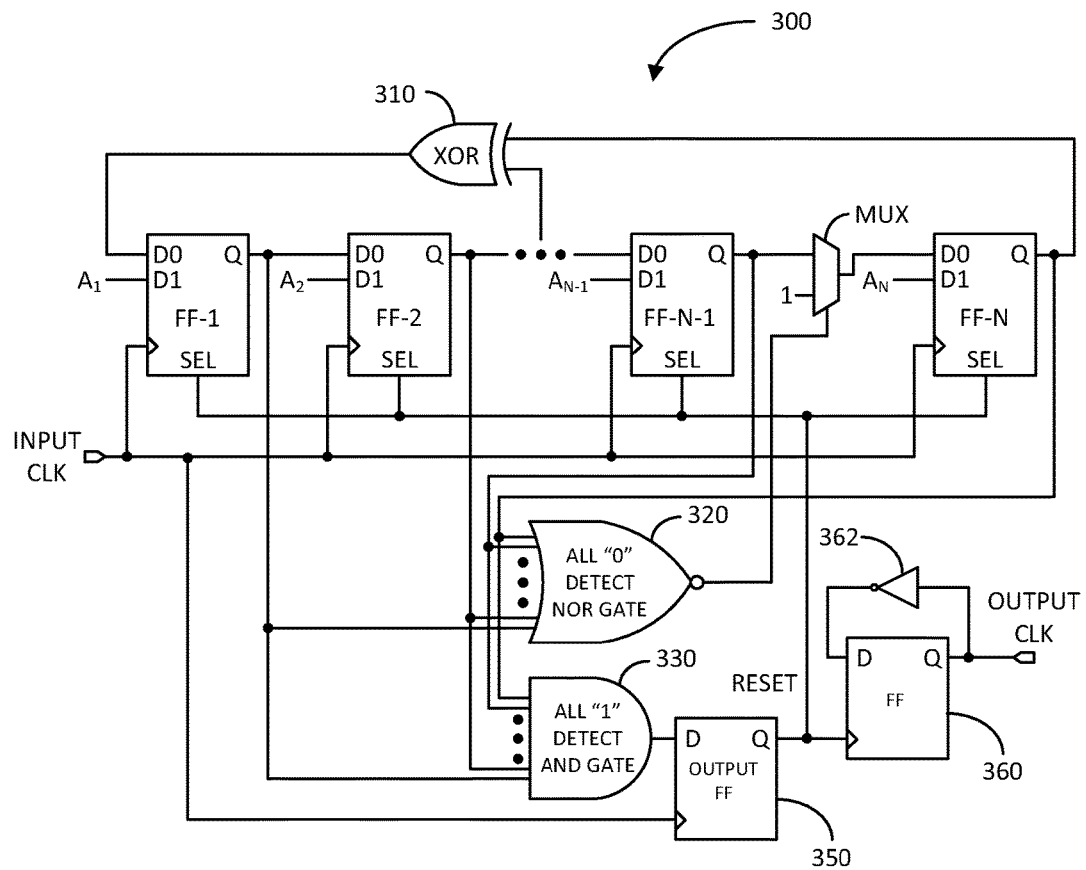
FIG. 3 illustrates a schematic diagram of another exemplary clock signal frequency divider in accordance with another aspect of the disclosure.

FIG. 3 illustrates a schematic diagram of another exemplary clock signal frequency divider 300 in accordance with another aspect of the disclosure. The clock signal frequency divider 300 may be used in PLL applications or other applications. For example, the frequency divider 300 may be a detailed implementation of any of the frequency dividers 150 and 160 of PLL 100 previously discussed.

In particular, the clock signal frequency divider 300 includes an LFSR with a set of two-input flip-flops FF-1 to FF-N, a single multiplexer MUX, and an exclusive-OR (XOR) gate 310. The two-input flip-flops FF-2 to FF-N-1 include first data inputs (D0) coupled to data outputs (Q) of the previous two-input flip-flops FF-1 to FF-N-2, respectively. The first two-input flip-flop FF-1 includes a first data input (D0) coupled to an output of the XOR gate 310. The last two-input flip-flop FF-N includes a first data output (D0) coupled to an output of the multiplexer MUX.

The second-to-last two-input flip-flop FF-N-1 includes a data output (Q) coupled to a first input of the multiplexer MUX. The last two-input flip-flop FF-N includes a data output (Q) coupled to a first input of the XOR gate. Depending on the configuration of the LFSR, one or more data outputs (Q) of the flip-flops may be coupled to one or more other inputs of the XOR gate 310, as represented by the second input of the XOR gate 310 shown coupled to ellipses representing two-input flip-flops. As an example, if the LFSR is implemented to produce an $x^9+x^5+1$ polynomial sequence, there are nine (9) flip-flops FF-1 to FF-9 (N=9), and the data outputs (Q) of the fifth and ninth two-input flip-flop FF-5 and FF-9 would be coupled to inputs of the XOR gate 310, respectively. If the LFSR is implemented to produce an $x^8+x^6+x^5+x^4+1$ polynomial sequence, there are eight (8) flip-flops FF-1 to FF-8 (N=8), and the data outputs (Q) of the fourth, fifth, sixth, and eighth two-input flip-flop FF-4, FF-5, FF-6, and FF-8 would be coupled to inputs of the XOR gate 310, respectively.

The two-input flip-flops FF-1 to FF-N include second data inputs (D1) configured to receive logic values $A_1$ to $A_N$ of a programmable initial state, respectively. The two-input flip-flops FF-1 to FF-N include clock inputs configured to receive an input clock signal, whose frequency is to be divided to generate an output clock signal. Additionally, the two-input flip-flops FF-1 to FF-N include select inputs configured to receive a RESET signal.

The clock signal frequency divider 300 further includes an invalid state elimination circuit including an all "0" detect NOR gate 320 with inputs coupled to the data outputs (Q) of the flip-flops FF-1 to FF-N, respectively. The all "0" detect NOR gate 320 includes an output coupled to a select input of the multiplexer MUX. The multiplexer MUX includes a second input configured to receive a logic "1", for example, by being coupled to an upper voltage rail $V_{DD}$. In response to detecting the invalid state of all logic zeros (0s) at the respective data outputs (Q) of the flip-flops FF-1 to FF-N, the all "0" detect NOR gate 320 generates an asserted output signal (e.g., a high logic voltage); otherwise, the all "0" detect NOR gate 320 generates a deasserted output signal (e.g., a low logic voltage).

In response to the asserted output signal generated by the all "0" detect NOR gate 320, the multiplexer MUX outputs the logic "1" at its second input to introduce a logic one (1) into the sequence to eliminate the invalid all zero state. In response to the deasserted output signal generated by the all "0" detect NOR gate 320, the multiplexer MUX outputs the logic value at the data output (Q) of the previous flip-flop (e.g., FF-N-1) to generate the sequence per normal operation of the LFSR.

The clock signal frequency divider 300 further includes an end-of-sequence detect circuit including an all "1" detect AND gate 330 with inputs coupled to the data outputs (Q) of the flip-flops FF-1 to FF-N, respectively. The end-of-sequence detect circuit further includes a flip-flop 350 including a data input (D) coupled to an output of the all "1" detect AND gate 330, and a clock input configured to receive the input clock signal. The flip-flop 350 includes a data output (Q) configured to generate the RESET signal.

The clock signal frequency divider 300 further includes an output clock generating circuit having a divide-by-two frequency divider including a flip-flop 360 with a clock input coupled to the data output (Q) of the flip-flop 350, and an inverter 362 including an input coupled to a data output (Q) of the flip-flop 360 and an input coupled to a data input (D) of the flip-flop 360 (i.e., in a feedback configuration). The output clock signal is generated at the data output (Q) of the flip-flop 360. Because of the divide-by-two frequency divider, the output clock signal has a substantially 50 percent duty cycle.

The clock signal frequency divider 300 operates as follows: if upon start-up (or other situation) the data outputs (Q) of the flip-flops FF-1 to FF-N produce all logic zeros (0s), respectively, the all "0" detect NOR gate 320 generates a high logic voltage. In response to this high logic voltage, the multiplexer MUX outputs the logic "1" at its second input, which is applied to the data input (D) of the flip-flop FF-N. In response to the next rising edge of the input clock signal, the flip-flop FF-N outputs the logic "1", causing the XOR 310 to output a logic "1"; thereby eliminating the invalid all "0" state. During normal operation (where the data outputs (Q) of the flip-flops FF-1 to FF-N do not produce the all "0" state), the all "0" detect NOR gate 320 outputs a deasserted signal (e.g., a low logic voltage), causing the multiplexer MUX to output the logic value at the data output (Q) of the flip-flop FF-N-1, so that the LFSR generates the sequence per normal sequencing operation.

During normal sequencing operation, the clock signal frequency divider 200 generates a sequence starting from the initial state $A_1$ to $A_N$ and ending with the all one state. The sequence is initiated in response to the RESET signal being asserted by the flip-flop 350, which may be in response to the all one state detected by the AND gate 330 signifying completion of a prior sequence. The asserted RESET signal causes the flip-flops FF-1 to FF-N to select their respective second inputs in order to output the initial state logic values $A_1$ to $A_N$ upon receiving the next rising edge of the input clock signal. In response to the flip-flops FF-1 to FF-N outputting the initial state logic values $A_1$ to $A_N$ (which is not set to all ones (1s)), the all "1" detect AND gate 330 generates a deasserted output (e.g., a low logic voltage). Then, upon the flip-flop 350 receiving the following rising edge of the input clock signal, the flip-flop 350 generates a deasserted RESET signal, which remains deasserted until the data outputs (Q) of the flip-flops FF-1 to FF-N once again become all ones (1s), signifying the end of the current sequence.

As previously discussed, the length of a sequence depends on the initial state $A_1$ to $A_N$. For example, if the initial state $A_1$ to $A_N$ is the first state in the sequence, then the length of the sequence is given by $2^N-1$. If the initial state $A_1$ to $A_N$ is the $J^{th}$ state of the sequence, then the length of the sequence is given by $2^N-J$. The frequency division ratio of the clock signal frequency divider 300 is the inverse of the length of the sequence, i.e., $1/(2^N-J)$. Thus, by controlling or setting the initial state $A_1$ to $A_N$ (and its $J^{th}$ position in the sequence), the frequency division ratio of the clock signal frequency divider 300 may be programmed.

The RESET signal generated by the flip-flop 350 has a period of $(2^N-J)*P_0$, where $P_0$ is the period of the input clock signal. More specifically, the RESET signal includes a pulse every period, wherein the pulse has a width of $\frac{1}{2}*P_0$. Thus, the duty cycle of the RESET signal is given by the following equation:

$$\text{Duty Cycle} = \frac{\frac{1}{2} \times P_0}{(2^N - J) \times P_0} = \frac{1}{2 \cdot (2^N - J)}$$

As an example, if N is nine (9) and J is one (1), then the duty cycle is 1/1022. For an output clock signal, such a small duty cycle is generally not functional. Accordingly, it would be desired to configure the output clock signal of the clock signal frequency divider 300 to be substantially 50 percent.

Accordingly, the divide-by-two frequency divider including the flip-flop 360 and the feedback inverter 362 is configured to generate a substantially 50 percent duty cycle output clock signal from the RESET signal. As illustrated, the RESET signal generated by the flip-flop 350 is applied to the clock input of the flip-flop 360. If the data output (Q) of the flip-flop 360 is a low logic voltage, the data input (D) of the flip-flop 360 is a high logic voltage due to the feedback inverter 362. Upon the next rising edge of the RESET signal, the flip-flop 360 outputs the low logic voltage at its data input (D) to its data output (Q), and, in response, the feedback inverter 362 generates a high logic voltage at the data input (D) of the flip-flop 360. Upon the following rising edge of the RESET signal, the flip-flop 360 outputs the high logic voltage at its data input (D) to its data output (Q), and, in response, the feedback inverter 362 generates a low logic voltage at the data input (D) of the flip-flop 360. Thus, the output clock signal changes logic state every rising edge of the RESET signal, resulting in substantially a 50 percent duty cycle output clock signal.

The clock signal frequency divider 300 has several advantages over clock signal frequency divider 200. For example, there is only a single gate, i.e., the all "1" detect AND gate 330 between the data outputs (Q) of the flip-flops FF-1 to FF-N and the flip-flop 350. Thus, the delay associated with generating the RESET signal in response to the all logic one state is significantly small as compared to that of clock signal frequency divider 200. This allows the frequency divider 300 to be operated at higher frequencies.

Further, in clock signal frequency divider 300, there is only a single multiplexer MUX between a pair of adjacent flip-flops FF-N−1 and FF-N; whereas in clock signal frequency divider 200, there are N−1 multiplexers between adjacent pairs of flip-flops FF-1 to FF-N in clock signal frequency divider 200. Accordingly, the delay in propagating the sequence logic values from flip-flop to flip-flop in frequency divider 300 is much smaller than the corresponding delay in frequency divider 200. Again, this allows the frequency divider 300 to be operated at higher frequencies.

It also follows that because there are significantly less multiplexers in clock signal frequency divider 300 and no OR gate as compared to that of clock signal frequency divider 200, the IC footprint needed to implement the frequency divider 300 is significantly less than the IC footprint needed to implement the frequency divider 200. Moreover, less parts also translates to less power consumption, which results in the clock signal frequency divider 300 being much more power efficient than frequency divider 200.

Other benefits of clock signal frequency divider 300 over frequency divider 200 include the divide-by-two frequency divider (i.e., flip-flop 360 and feedback inverter 362). This allows the output clock signal to have a substantially 50 percent duty cycle, which is more useful as a clock signal than would be otherwise.

Figure 4:
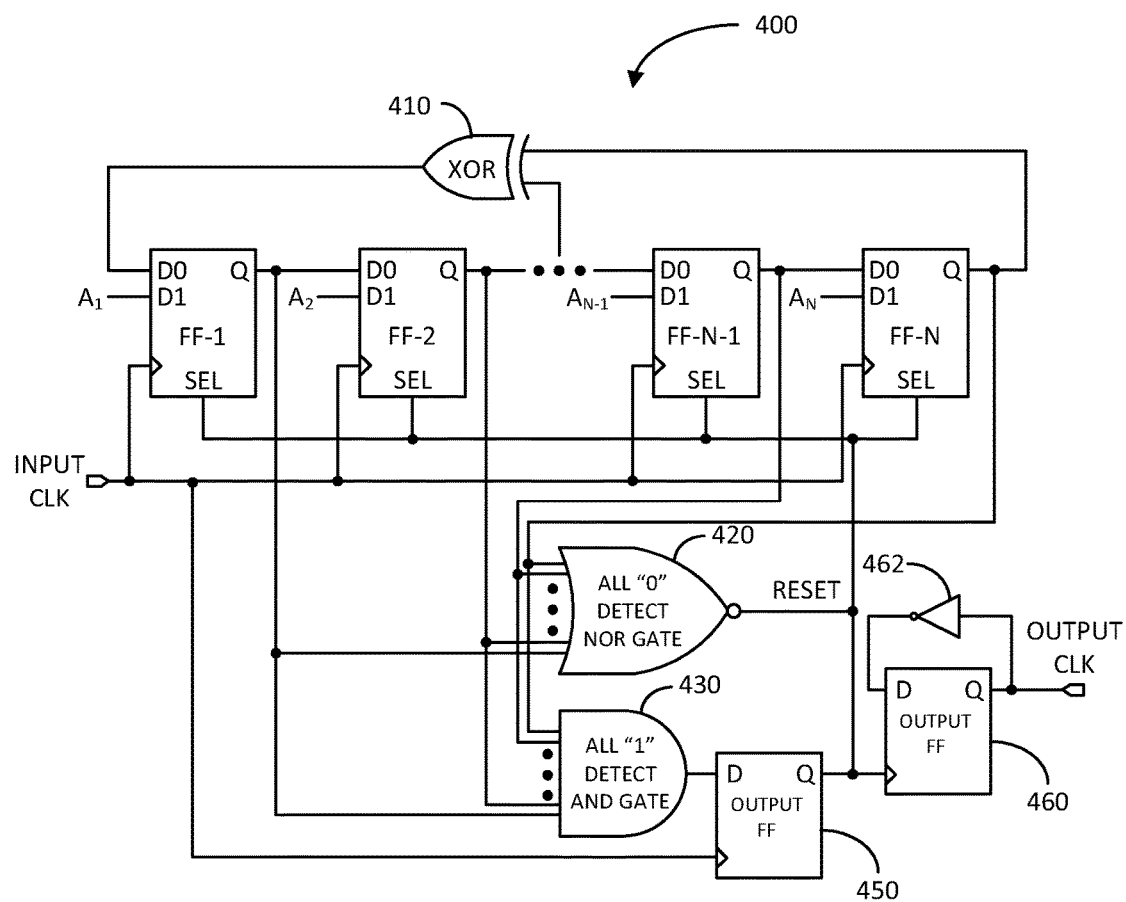
FIG. 4 illustrates a schematic diagram of another exemplary clock signal frequency divider in accordance with another aspect of the disclosure.

FIG. 4 illustrates a schematic diagram of yet another exemplary clock signal frequency divider 400 in accordance with another aspect of the disclosure. Similarly, the clock signal frequency divider 400 may be used in PLL applications or other applications. For example, the frequency divider 400 may be a detailed implementation of any of the frequency dividers 150 and 160 of PLL 100 previously discussed.

The clock signal frequency divider 400 is similar to that of frequency divider 300, with the exception that the single multiplexer MUX has been eliminated from frequency divider 400 and the output of the all "0" detect NOR gate 420 is coupled to the select inputs of the two-input flip-flops FF-1 to FF-N. Because, in this embodiment, the output of the all "0" detect NOR gate 420 is also coupled to a data output (Q) of a flip-flop 450, the output of the all "0" detect NOR gate 420 may be tristated (e.g., produce a relatively high output impedance) when the all one state is not present so that functional interference with the flip-flop 450 is avoided.

The clock signal frequency divider 400 includes many of the same components and in the same configuration as frequency divider 300, including the LFSR with the cascaded two-input flip-flops FF-1 to FF-N and a feedback XOR 410 including at least two inputs coupled to at least two data outputs (Q) of the flip-flops FF-1 to FF-N based on the polynomial configuration for the LFSR. The first data inputs (D0) are used to form the feedback loop of the LFSR for generating the $2^N-1$ distinct valid states of a sequence when the first data inputs (D0) are selected based on a deasserted RESET signal applied to the select inputs of the flip-flops FF-1 to FF-N and an input clock signal being applied to the clock inputs of the flip-flops FF-1 to FF-N. Similarly, logic values $A_1$ to $A_N$ of an initial valid state are applied to second inputs (D1) of the flip-flops FF-1 to FF-N for introducing the initial state to the sequence in response to an asserted RESET signal applied to the select inputs of the flip-flops FF-1 to FF-N.

Similarly, the clock signal frequency divider 400 includes an end-of-sequence detection circuit including an all "1" detect AND gate 430 including inputs coupled to the data outputs (Q) of the flip-flops FF-1 to FF-N, respectively, and an output coupled to a data input (D) of a flip-flop 450. The flip-flop 450 includes a clock input configured to receive the input clock signal, and a data output (Q) configured to generate the RESET signal. The clock signal frequency divider 400 additionally includes a clock generating circuit configured as a divide-by-two frequency divider including flip-flop 460 having a clock input configured to receive the RESET signal generated by the flip-flop 450 and a feedback inverter 462 including an input coupled to a data output (Q) of the flip-flop 460 and an output coupled to a data input (D) of the flip-flop 460. An output clock signal, which has a substantially 50 percent duty cycle, is generated at the data output (Q) of the flip-flop 460.

As discussed above, the clock signal frequency divider 400 differs from frequency divider 300 in that divider 400 includes an invalid state elimination circuit with an all "0" detect NOR gate 420 including inputs coupled to the data outputs (Q) of the flip-flops FF-1 to FF-N, respectively, and an output configured to generate the RESET signal, which is applied to the select inputs of the flip-flops FF-1 to FF-N. Thus, when the all "0" detect NOR gate 420 detects the all zero state at the data outputs (Q) of the flip-flops FF-1 to FF-N, it asserts the RESET signal to cause the flip-flops FF-1 to FF-N to output the programmable logic values $A_1$ to $A_N$ of the initial state. The logic values $A_1$ to $A_N$ is a valid state of the $2^N-1$ sequence; thereby, eliminating the invalid all zero state.

The clock signal frequency divider 400 has similar advantages as frequency divider 300 over frequency divider 200. In summary, these advantages include: (1) a single gate between the data outputs (Q) of the flip-flops FF-1 to FF-N and the flip-flop 450 to reduce the propagation delay therebetween and improve the speed of the frequency divider 400; (2) no multiplexers between adjacent flip-flops FF-1 to FF-N to reduce the delay in propagating the sequence logic values from flip-flop to flop-flop to further improve the speed of the frequency divider; (3) significantly less components (e.g., no multiplexers and no OR gate) to reduce the IC footprint and consume less power; and (4) the divide-by-two frequency divider to generate a substantially 50 percent duty cycle output clock signal.

Figure 5:
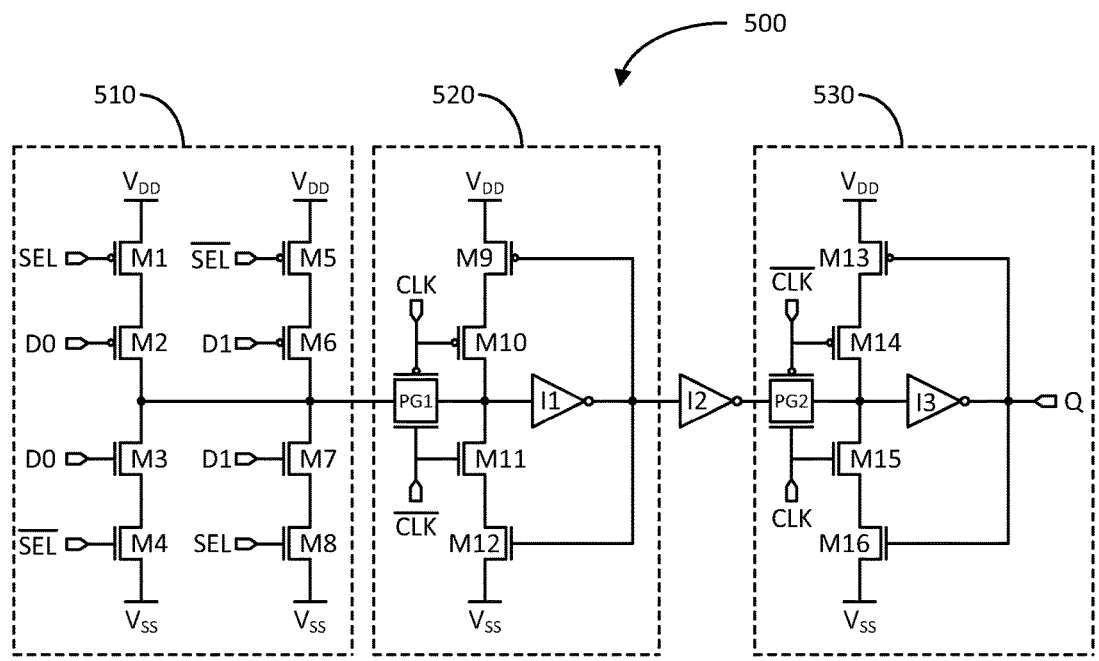
FIG. 5 illustrates a schematic diagram of an exemplary two-input flip-flop in accordance with another aspect of the disclosure.

FIG. 5 illustrates a schematic diagram of an exemplary two-input flip-flop 500 in accordance with another aspect of the disclosure. The two-input flip-flop 500 may be an exemplary detailed implementation of any of the two-input flip-flops FF-1 to FF-N of clock signal frequency dividers 300 and 400, and clock signal frequency dividers 700 and 800 described further herein.

In particular, the two-input flip-flop 500 includes a multiplexer circuit 510, a first clock-driven inverter circuit 520, a second inverter I2, and a second clock-driven inverter circuit 530.

The multiplexer circuit 510 includes p-channel metal oxide semiconductor field effect transistor (PMOS FET) M1, PMOS FET M2, n-channel metal oxide semiconductor field effect transistor (NMOS FET) M3, and NMOS FET M4, all coupled in series between the upper voltage rail $V_{DD}$ and a lower voltage rail $V_{SS}$ (e.g., ground). The PMOS FET M1 includes a gate configured as the select input SEL of the flip-flop 500, which receives the RESET signal in clock signal frequency dividers 300, 400, 700, and 800. The PMOS FET M2 and NMOS FET M3 include gates configured as the first data input (D0) of the flip-flop 500. The PMOS FET M4 includes a gate configured as a complementary select input $\overline{SEL}$, which may be configured to receive a complementary of the RESET signal (e.g., $\overline{RESET}$ signal).

Similarly, the multiplexer circuit 510 further includes PMOS FETs M5 and M6 and NMOS FETs M7 and M8, all coupled in series between the upper voltage rail $V_{DD}$ and the lower voltage rail $V_{SS}$. The PMOS FET M5 includes a gate configured as the complementary select input $\overline{SEL}$ of the flip-flop 500, which receives the complementary $\overline{RESET}$ signal in clock signal frequency dividers 300, 400, 700, and 800. The PMOS FET M6 and NMOS FET M7 include gates configured as the second data input (D1) of the flip-flop 500. The PMOS FET M8 includes a gate configured as the select input SEL, which may be configured to receive the RESET signal. The multiplexer circuit 510 includes an output at the common drains of FETs M2, M3, M6, and M7.

The first clock-driven inverter circuit 520 includes PMOS FETs M9 and M10 and NMOS FETs M11 and M12, all coupled in series between the upper voltage rail $V_{DD}$ and the lower voltage rail $V_{SS}$. The first clock-driven inverter circuit 520 further includes a first pass gate PG1 with a first terminal coupled to the output of the multiplexer circuit 510 and a second terminal coupled to the drains of FETs M10 and M11. The first pass gate PG1 includes a non-complementary control input configured to receive a complementary clock signal $\overline{CLK}$, and a complementary control input configured to receive the clock signal CLK. The clock signal CLK and the complementary clock signal $\overline{CLK}$ may be based on the input clock signal of clock signal frequency dividers 300, 400, 700, and 800. The first clock-driven inverter circuit 520 further includes a first inverter I1 including an input coupled to the drains of FETs M10 and M11, and an output coupled to the gates of FETs M9 and M12. The second inverter I2 includes an input coupled to the output of the first inverter I1.

The second clock-driven inverter circuit 530 includes PMOS FETs M13 and M14 and NMOS FETs M15 and M16, all coupled in series between the upper voltage rail $V_{DD}$ and the lower voltage rail $V_{SS}$. The second clock-driven inverter circuit 530 further includes a second pass gate PG2 with a first terminal coupled to an output of the second inverter I2 and a second terminal coupled to the drains of FETs M14 and M15. The second pass gate PG2 includes a non-complementary control input configured to receive the clock signal CLK and a complementary control input configured to receive the complementary clock signal $\overline{CLK}$. The second clock-driven inverter circuit 530 further includes a third inverter I3 including an input coupled to the drains of FETs M14 and M15, and an output coupled to the gates of FETs M13 and M16. The output of the third inverter I3 serves as a data output (Q) of the flip-flop 500.

In operation, the multiplexer circuit 510 is configured to output, albeit inverted, the data at the first data input (D0) or the data at the second data input (D1) based on the RESET signal at the select input. For example, if the RESET signal is not asserted (e.g., a low logic voltage), the multiplexer circuit 510 outputs the inverted data at the first data input (D0). This is because the RESET signal being low causes the FETs M1 and M4 to turn on, enabling the series path of FETs M1-M4; while causing the FETs M5 and M6 to turn off, disabling the series path of FETs M5-M8. If the data at the first data input (D0) is a logic low, FET M2 is turned on and FET M3 is turned off. Accordingly, the multiplexer circuit 510 outputs a high logic voltage, i.e., the inverted low logic voltage at the first data input (D0). If the data at the first data input (D0) is a logic high, FET M2 is turned off and FET M3 is turned on. Accordingly, the multiplexer circuit 510 outputs a low logic voltage, i.e., the inverted high logic voltage at the first data input (D0).

Similarly, if the RESET signal is asserted (e.g., a high logic voltage), the multiplexer circuit 510 outputs the inverted data at the second data input (D1). This is because the RESET signal being high causes the FETs M5 and M8 to turn on, enabling the series path of FETs M5-M8; while causing the FETs M1 and M4 to turn off, disabling the series path of FETs M1-M4. If the data at the second data input (D1) is a logic low, FET M6 is turned on and FET M7 is turned off. Accordingly, the multiplexer circuit 510 outputs a high logic voltage, i.e., the inverted low logic voltage at the second data input (D1). If the data at the second data input (D1) is a logic high, FET M6 is turned off and FET M7 is turned on. Accordingly, the multiplexer circuit 510 outputs a low logic voltage, i.e., the inverted high logic voltage at the second data input (D1).

The first clock-driven inverter circuit 520 is configured to output the double-inverted data based on the inverted data at the output of the multiplexer circuit 510 in response to a falling edge of the input clock signal CLK. For example, when the input clock signal CLK is at a high logic voltage, the first pass gate PG1 is turned off, preventing the inverted data at the output of the multiplexer circuit 510 from passing to the first inverter I1. The input clock signal CLK being at a high logic voltage also turns off FETs M10 and M11; thereby, effectively disabling the first clock-driven inverter circuit 520.

When the input clock signal CLK transitions to a low logic voltage (e.g., a falling edge), the first pass gate PG1 turns on and passes the inverted data to the first inverter I1. The input clock signal CLK being at a low logic voltage also causes the FETs M10 and M11 to turn on. The first inverter I1 inverts the inverted data to generate a double-inverted data (or data at the same logic level at the selected input D0 or D1). For example, if the inverted data at the output of the multiplexer circuit 510 is logically low, the first inverter I1 outputs a high logic voltage. This causes FET M9 to turn off to isolate the low logic voltage at the input of the first inverter I1 from $V_{DD}$. The high logic voltage at the output of the first inverter I1 also causes FET M12 to turn on to force the low logic voltage at the input of the first inverter I1 to $V_{SS}$ potential (e.g., ground).

If, on the other hand, the inverted data at the output of the multiplexer circuit 510 is logically high, the first inverter I1 outputs a low logic voltage. This causes FET M9 to turn on to apply $V_{DD}$ to the input of the first inverter I1 to ensure that its input is at a high logic voltage. The low logic voltage at the output of the first inverter I1 also causes FET M12 to turn off to isolate the high logic voltage at the input of the first inverter I1 from $V_{SS}$ potential (e.g., ground).

The second inverter I2 outputs a triple-inverted data in response to the double-inverted data at its input. This is done to ensure that the data at the data output (Q) of the flip-flop 500 is at the same logic level as the data at the selected data input (D0) or (D1).

The second clock-driven inverter circuit 530 is configured to output a quadruple-inverted data in response to the triple-inverted data at the output of the second inverter I2 based on a rising edge of the input clock signal CLK. For example, when the input clock signal CLK is at a low logic voltage, the second pass gate PG2 is turned off, preventing the triple-inverted data at the output of the second inverter I2 from passing to the third inverter I3. The input clock signal CLK being at a low logic voltage also turns off FETs M14 and M15; thereby, effectively disabling the second clock-driven inverter circuit 530.

When the input clock signal CLK transitions to a high logic voltage (e.g., a rising edge), the second pass gate PG2 turns on and passes the triple-inverted data to the input of the third inverter I3. The input clock signal CLK being at a high logic voltage also causes the FETs M14 and M15 to turn on. If the triple-inverted data at the output of the second inverter I2 is logically low, the third inverter I3 outputs a high logic voltage. This causes FET M13 to turn off to isolate the low logic voltage at the input of the third inverter I3 from $V_{DD}$. The high logic voltage at the output of the third inverter I3 also causes FET M16 to turn on to force the low logic voltage at the input of the third inverter I3 to $V_{SS}$ potential (e.g., ground).

If, on the other hand, the triple-inverted data at the output of the second inverter I2 is logically high, the third inverter I3 outputs a low logic voltage. This causes FET M13 to turn on to apply $V_{DD}$ to the input of the third inverter I3 to ensure that its input is at a high logic voltage. The low logic voltage at the output of the third inverter I3 also causes FET M16 to turn off to isolate the high logic voltage at the input of the third inverter I3 from $V_{SS}$ potential (e.g., ground). Because the second clock-driven inverter 530 generates a quadruple-inverted data, the data at the data output (Q) of the flip-flop 500 is at the same logic level as the data at the selected input (D0) or (D1) of the flip-flop 500.

Figure 6:
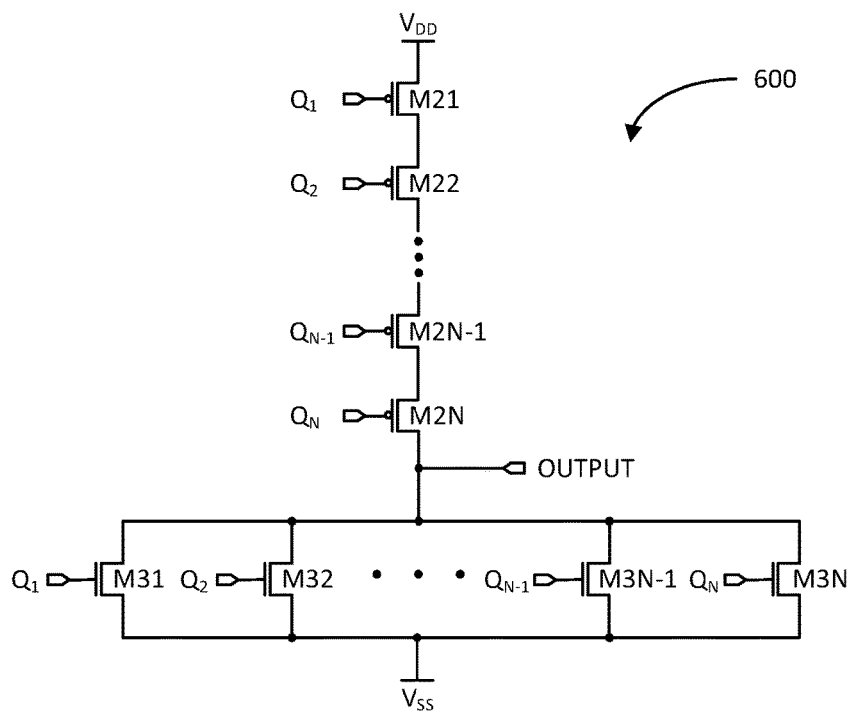
FIG. 6 illustrates a schematic diagram of an exemplary multiple-input NOR gate in accordance with another aspect of the disclosure.

FIG. 6 illustrates a schematic diagram of an exemplary all "0" detect NOR gate 600 in accordance with another aspect of the disclosure. The all "0" detect NOR gate 600 may be an exemplary detailed implementation of any of the all-zero-detect NOR gates 320 and 420 of clock signal frequency dividers 300 and 400, respectively.

The all "0" detect NOR gate 600 includes PMOS FETs M21 to M2N coupled in series between the upper voltage rail $V_{DD}$ and an output of the all "0" detect NOR gate 600. The gates of the PMOS FETs M21 and M2N are coupled to the data outputs $(Q_1)$ to $(Q_N)$ of the flip-flops FF-1 to FF-N, respectively. The all "0" detect NOR gate 600 further includes NMOS FETs M31 to M3N coupled in parallel between the output of the all "0" detect NOR gate 600 and the lower voltage rail $V_{SS}$. The gates of the NMOS FETs M31 and M3N are coupled to the data outputs $(Q_1)$ to $(Q_N)$ of the flip-flops FF-1 to FF-N, respectively.

In operation, if one or more of the data outputs (Q1) to (QN) of the flip-flops FF-1 to FF-N, respectively, are at a high logic voltage, one or more of the PMOS FETs M21 to M2N are off, and one or more of the NMOS FETs M31 to M3N are on. The one or more of the PMOS FETs M21 to M2N that are turned off isolates the upper voltage rail $V_{DD}$ from the output of the all "0" detect NOR gate 600. The one or more of the NMOS FETs M31 to M3N that are turned on couples the output of the all "0" detect AND gate 600 to the lower voltage rail $V_{SS}$ to generate a low logic voltage at the output. Thus, when the all zero state is not present, the all "0" detect NOR gate 600 generates a deasserted low logic voltage. Further, in this configuration, the NOR gate 600 consumes relatively no power as there is no current path between the upper voltage rail $V_{DD}$ and the lower voltage rail $V_{SS}$.

If all the data outputs (Q1) to (QN) of the flip-flops FF-1 to FF-N, respectively, are at low logic voltages, all of the PMOS FETs M21 to M2N are turned on, and all of the NMOS FETs M31 to M3N are turned off. The turned-on PMOS FETs M21 to M2N couple the upper voltage rail $V_{DD}$ to the output of the all "0" detect NOR gate 600 to produce an asserted high logic voltage indicating that the all zero state is present. The turned off NMOS FETs M31 to M3N isolate the output of the all "0" detect NOR gate 600 from the lower voltage rail $V_{SS}$ to prevent a short circuit. Thus, when the all zero state is present, the all "0" detect NOR gate 600 generates an asserted high logic voltage. Further, in this configuration, the NOR gate 600 consumes relatively no power as there is no current path between the upper voltage rail $V_{DD}$ and the lower voltage rail $V_{SS}$.

Figure 7:
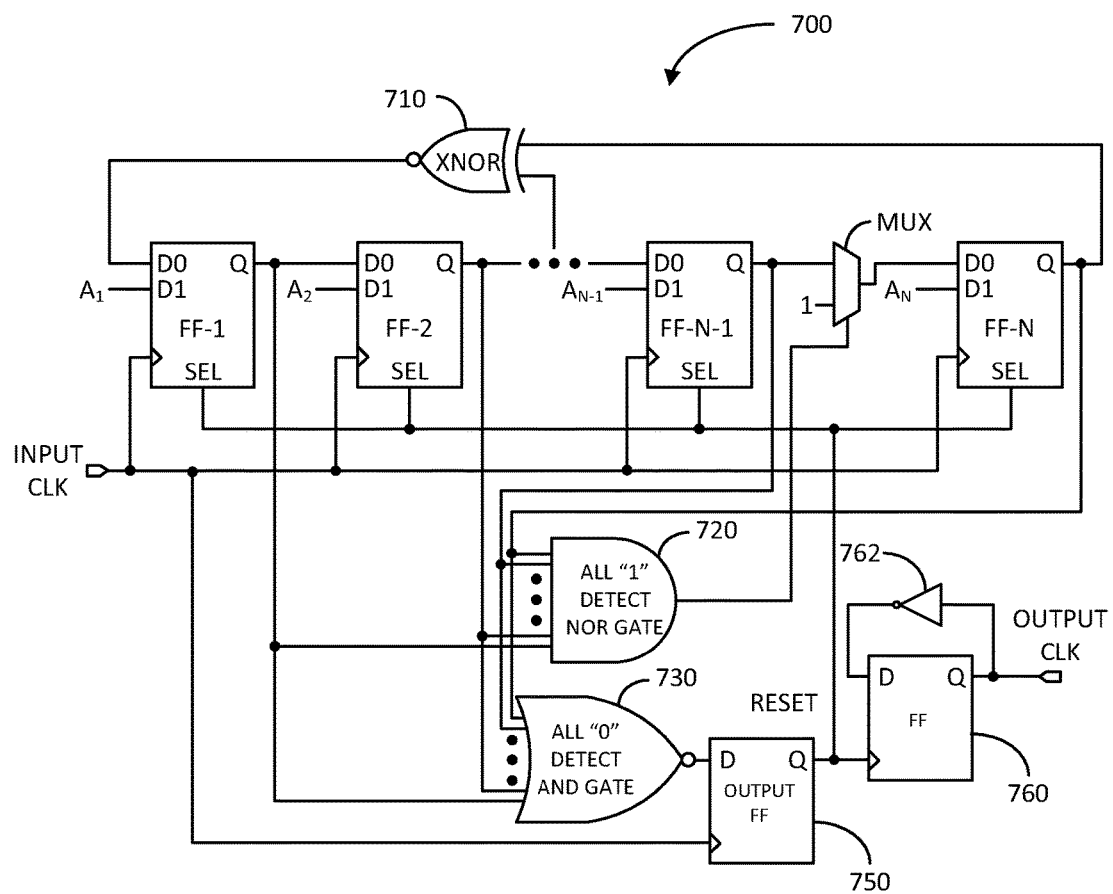
FIG. 7 illustrates a schematic diagram of yet another exemplary clock signal frequency divider in accordance with another aspect of the disclosure.

FIG. 7 illustrates a schematic diagram of yet another exemplary clock frequency divider 700 in accordance with another aspect of the disclosure. The clock frequency divider 700 is similar to that of clock frequency divider 300, but includes an exclusive-NOR gate 710 (instead of the XOR gate 310), an all "1" detect AND gate 720 configured to assert the RESET signal in response to detecting the invalid state of all logic ones (instead of the all "0" detect NOR gate 320 configured to assert the RESET signal in response to detecting the invalid state of all logic zeros), and an all "0" detect NOR gate 730 configured to initiate the assertion of the RESET signal by a flip-flop 750 in response to detecting the end state of all zeros (instead of the all "1" detect AND gate 330 configured to initiate the assertion of the RESET signal by the flip-flop 350 in response to detecting the end state of all ones).

The remaining components of the clock signal frequency divider 700 is essentially the same as the corresponding components of the clock signal frequency divider 300, including the two-input flip-flops FF-1 to FF-N, the multiplexer MUX, and the output clock signal generating circuit including flip-flop 760 and feedback inverter 762. Instead of generally increasing the logic values of the states of the sequence towards the all one state as in clock signal frequency divider 300, the clock signal frequency divider 700 generally decreases the logic values of the states of the sequence towards the all zero state.

Figure 8:
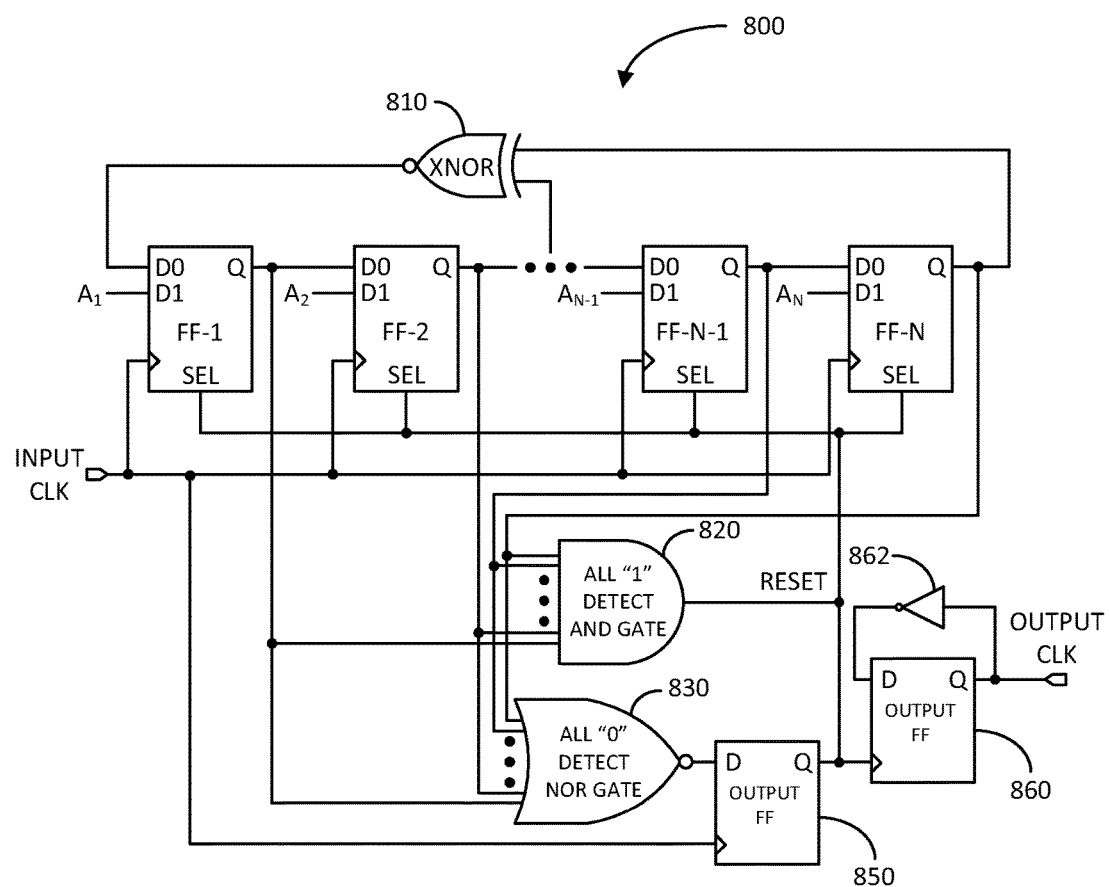
FIG. 8 illustrates a schematic diagram of still another exemplary clock signal frequency divider in accordance with another aspect of the disclosure.

FIG. 8 illustrates a schematic diagram of yet another exemplary clock frequency divider 800 in accordance with another aspect of the disclosure. The clock frequency divider 800 is similar to that of clock frequency divider 400, but includes an exclusive-NOR gate 810 (instead of the XOR gate 410), an all "1" detect AND gate 820 configured to assert the RESET signal in response to detecting the invalid state of all logic ones (instead of the all "0" detect NOR gate 420 configured to assert the RESET signal in response to detecting the invalid state of all logic zeros), and an all "0" detect NOR gate 830 configured to initiate the assertion of the RESET signal by a flip-flop 850 in response to detecting the end state of all zeros (instead of the all "1" detect AND gate 430 configured to initiate the assertion of the RESET signal by the flip-flop 450 in response to detecting the end state of all ones).

The remaining components of the clock signal frequency divider 800 is essentially the same as the corresponding components of the clock signal frequency divider 400, including the two-input flip-flops FF-1 to FF-N, and the output clock signal generating circuit including flip-flop 860 and feedback inverter 862. Instead of generally increasing the logic values of the states of the sequence towards the all one state as in clock signal frequency divider 400, the clock signal frequency divider 800 generally decreases the logic values of the states of the sequence towards the all zero state.

Figure 9:
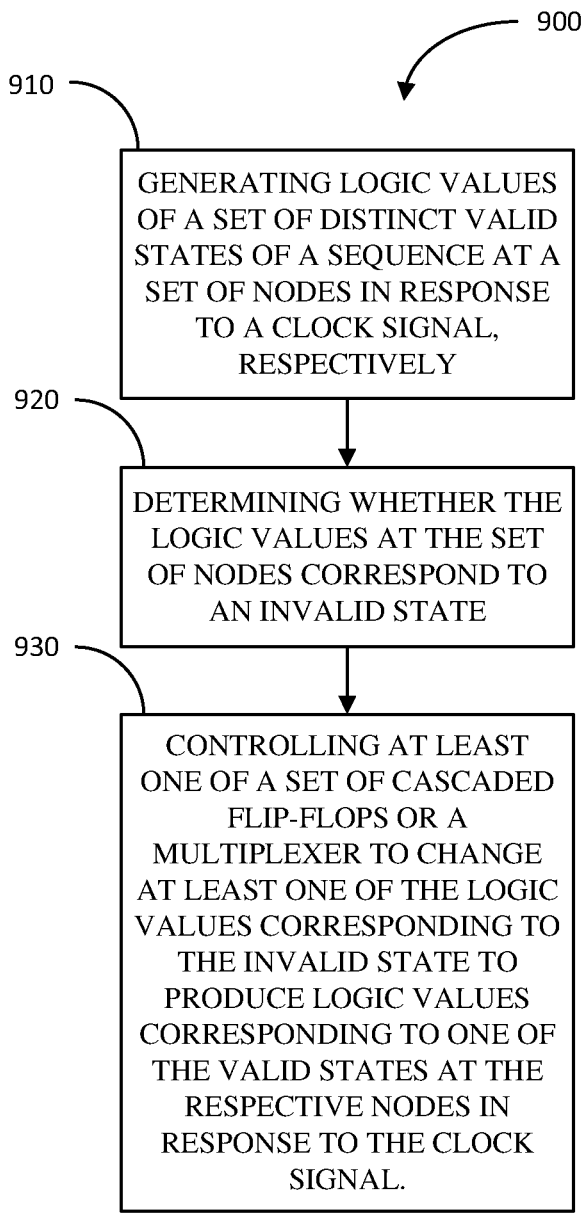
FIG. 9 illustrates a flow diagram of an exemplary method of operating a linear feedback shift register (LFSR) in accordance with another aspect of the disclosure.

FIG. 9 illustrates a flow diagram of an exemplary method 900 of operating an LFSR in accordance with another aspect of the disclosure.

The method 900 includes generating logic values of a set of distinct valid states of a sequence at a set of nodes in response to a clock signal, respectively (block 910). Examples of means of generating logic values of a set of distinct valid states of a sequence at a set of nodes in response to an input clock signal, respectively, include any of the set of cascaded flip-flops coupled to the feedback exclusive-OR gate or exclusive-NOR gate of the clock signal frequency dividers 300, 400, 700, and 800.

The method 900 further includes determining whether the logic values at the set of nodes correspond to an invalid state (block 920). Examples of means for determining whether the logic values at the set of nodes correspond to an invalid state include the all "0" detect NOR gates 320 and 420 in clock signal frequency dividers 300 and 400, respectively, and the all "1" detect AND gates 720 and 820 in clock signal frequency dividers 700 and 800, respectively.

Additionally, the method 900 further includes controlling at least one of a set of cascaded flip-flops or a multiplexer to change at least one of the logic values corresponding to the invalid state to produce logic values corresponding to one of the valid states at the respective nodes in response to the clock signal (block 930).

Examples of means for controlling at least one of a set of cascaded flip-flops to change at least one of the logic values corresponding to the invalid state to produce logic values corresponding to one of the valid states at the respective nodes in response to the clock signal include the select input of the flip-flops FF-1 to FF-N receiving the RESET signal and one of the two data inputs of the flip-flops receiving logic values $A_1$ to $A_N$ associated with a valid state in clock signal frequency dividers 400 and 800.

Examples of means for controlling a multiplexer to change at least one of the logic values corresponding to the invalid state to produce logic values corresponding to one of the valid states at the respective nodes in response to the clock signal include the select input of the multiplexer MUX receiving the RESET signal and one of the two data inputs of the multiplexer MUX receiving a logic value associated with a valid state in clock signal frequency dividers 300 and 700.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first logic gate;
   a set of cascaded flip-flops, wherein each of the flip-flops includes first and second data inputs, a data output, a clock input, and a select input, wherein the first data input of one of the set of cascaded flip-flops is coupled to an output of the first logic gate, wherein at least two data outputs of the set of cascaded flip-flops are coupled to at least two inputs of the first logic gate, respectively, wherein the select inputs of the set of cascaded flip-flops are configured to receive a first control signal, and wherein the second data inputs are configured to receive logic values of an initial valid state of a sequence;
   wherein the set of cascaded flip-flops are configured to:
      generate distinct valid states of the sequence at their respective data outputs in response to a first clock signal applied to the clock inputs of the set of cascaded flip-flops and the first control signal being deasserted; and
      generate the initial valid state of the sequence at their respective data outputs in response to the first clock signal and the first control signal being asserted;
   an invalid-state elimination circuit configured to:
      detect an invalid state at the data outputs of the set of cascaded flip-flops; and
      control the set of cascaded flip-flops to produce one of the distinct valid states at their data outputs in response to detecting the invalid state and the first clock signal; and
   an end-of-sequence control circuit configured to:
      generate the asserted first control signal in response to detecting one of the states of the sequence, and
      generate the deasserted first control signal in response to not detecting the one of the states of the sequence.

2. The apparatus of claim 1, wherein the one of the distinct valid states comprises the initial valid state of the sequence.

3. The apparatus of claim 1, wherein the invalid-state elimination circuit comprises a second logic gate including inputs coupled to the data outputs of the set of cascaded flip-flops, respectively, and an output configured to produce the asserted first control signal in response to detecting the invalid state and produce the deasserted first control signal in response to not detecting the invalid state.

4. The apparatus of claim 3, wherein the first logic gate comprises an exclusive-OR gate, wherein the second logic gate comprises a NOR gate, and wherein the invalid state comprises all logic zeros at the data outputs of the set of cascaded flip-flops, respectively.

5. The apparatus of claim 4, wherein the NOR gate comprises:
   a set of p-channel metal oxide semiconductor field effect transistors (PMOS FETs) coupled in series between an upper voltage rail and the output of the NOR gate, wherein the PMOS FETs include gates coupled to the data outputs of the cascaded flip-flops, respectively; and
   a set of n-channel metal oxide semiconductor field effect transistors (NMOS FETs) coupled in parallel between the output of the NOR gate and a lower voltage rail, wherein the NMOS FETs include gates coupled to the data outputs of the cascaded flip-flops, respectively.

6. The apparatus of claim 3, wherein the first logic gate comprises an exclusive-NOR gate, wherein the second logic gate comprises an AND gate, and wherein the invalid state comprises all logic ones at the data outputs of the set of cascaded flip-flops, respectively.

7. The apparatus of claim 1, wherein the one of the states of the sequence consists of all logic ones.

8. The apparatus of claim 7, wherein the end-of-sequence control circuit comprises:
    an AND gate including inputs coupled to the data outputs of the set of cascaded flip-flops, and an output configured to produce an asserted signal in response to logic values at the data outputs of the set of cascaded flip-flops being all logic ones, and produce a deasserted signal in response to logic values at the data outputs of the set of cascaded flip-flops not being all logic ones; and
    a first flip-flop including a data input coupled to an output of the AND gate, a clock input configured to receive the first clock signal, and a data output configured to generate the asserted first control signal in response to the asserted signal and the first clock signal, and the deasserted first control signal in response to the deasserted signal and the first clock signal.

9. The apparatus of claim 1, wherein the one of the states of the sequence consists of all logic zeros.

10. The apparatus of claim 9, wherein the end-of-sequence control circuit comprises:
    a NOR gate including inputs coupled to the data outputs of the set of cascaded flip-flops, and an output configured to produce an asserted signal in response to logic values at the data outputs of the set of cascaded flip-flops being all logic zeros, and produce a deasserted signal in response to logic values of the data outputs of the set of cascaded flip-flops not being all logic zeros; and
    a first flip-flop including a data input coupled to an output of the NOR gate, a clock input configured to receive the first clock signal, and a data output configured to generate the asserted first control signal in response to the asserted signal and the first clock signal, and the deasserted first control signal in response to the deasserted signal and the first clock signal.

11. The apparatus of claim 10, further comprising a clock generating circuit configured to generate a second clock signal in response to the first control signal.

12. The apparatus of claim 11, wherein the clock generating circuit comprises:
    an inverter; and
    a second flip-flop including a clock input coupled to the data output of the first flip-flop, a data input coupled to an output of the inverter, and a data output coupled to an input of the inverter, wherein the data output of the second flip-flop is configured to generate the second clock signal.

13. An apparatus, comprising:
    a first logic gate;
    a set of cascaded flip-flops, wherein each of the flip-flops includes first and second data inputs, a data output, a clock input, and a select input, wherein the first data input of one of the set of cascaded flip-flops is coupled to an output of the first logic gate, wherein at least two data outputs of the set of cascaded flip-flops are coupled to at least two inputs of the first logic gate, respectively, wherein the select inputs of the set of cascaded flip-flops are configured to receive a first control signal, and wherein the second data inputs are configured to receive logic values of an initial valid state of a sequence;
    wherein the set of cascaded flip-flops are configured to:
        generate distinct valid states of the sequence at their respective data outputs in response to a first clock signal applied to the clock inputs of the set of cascaded flip-flops and the first control signal being deasserted; and
        generate the initial valid state of the sequence at their respective data outputs in response to the first clock signal and the first control signal being asserted; and
    an invalid-state elimination circuit configured to:
        detect an invalid state at the data outputs of the set of cascaded flip-flops; and
        control the set of cascaded flip-flops to produce one of the distinct valid states at their data outputs in response to detecting the invalid state and the first clock signal;
    wherein the invalid-state elimination circuit comprises:
        a second logic gate configured to:
            receive logic values at the data outputs of the set of cascaded flip-flops, respectively; and
            generate a second control signal based on the logic values, wherein the second control signal is asserted in response to the logic values corresponding to the invalid state, and wherein the second control signal is deasserted in response to the logic values not corresponding to the invalid state; and
        a multiplexer comprising:
            a first input coupled to the data output of one of the cascaded flip-flops;
            a second input configured to receive a predetermined logic value;
            an output coupled to the first data input of another of the cascaded flip-flops; and
            a select input configured to receive the second control signal, wherein the multiplexer is configured to couple the first input to the output in response to the second control signal being deasserted, and wherein the multiplexer is configured to couple the second input to the output in response to the second control signal being asserted.

14. The apparatus of claim 13, wherein the first logic gate comprises an exclusive-OR gate, wherein the second logic state comprises a NOR gate, wherein the invalid state comprises all logic zeros at the data outputs of the set of cascaded flip-flops, respectively, and wherein the predetermined logic value comprises a logic one.

15. The apparatus of claim 13, wherein the first logic gate comprises an exclusive-NOR gate, wherein the second logic state comprises an AND gate, wherein the invalid state comprises all logic ones at the data outputs of the set of cascaded flip-flops, respectively, and wherein the predetermined logic value comprises a logic zero.

16. An apparatus, comprising:
    a first logic gate;
    a set of cascaded flip-flops, wherein each of the flip-flops includes first and second data inputs, a data output, a clock input, and a select input, wherein the first data input of one of the set of cascaded flip-flops is coupled to an output of the first logic gate, wherein at least two data outputs of the set of cascaded flip-flops are coupled to at least two inputs of the first logic gate, respectively, wherein the select inputs of the set of cascaded flip-flops are configured to receive a first control signal, and wherein the second data inputs are configured to receive logic values of an initial valid state of a sequence;

wherein the set of cascaded flip-flops are configured to:
  generate distinct valid states of the sequence at their respective data outputs in response to a first clock signal applied to the clock inputs of the set of cascaded flip-flops and the first control signal being deasserted; and
  generate the initial valid state of the sequence at their respective data outputs in response to the first clock signal and the first control signal being asserted; and
an end-of-sequence control circuit configured to:
  generate the asserted first control signal in response to detecting one of the states of the sequence, wherein the one of the states of the sequence consists of all logic ones, and
  generate the deasserted first control signal in response to not detecting the one of the states of the sequence;
wherein the end-of-sequence control circuit comprises:
  an AND gate including inputs coupled to the data outputs of the set of cascaded flip-flops, and an output configured to produce an asserted signal in response to logic values at the data outputs of the set of cascaded flip-flops being all logic ones, and produce a deasserted signal in response to logic values at the data outputs of the set of cascaded flip-flops not being all logic ones; and
  a first flip-flop including a data input coupled to an output of the AND gate, a clock input configured to receive the first clock signal, and a data output configured to generate the asserted first control signal in response to the asserted signal and the first clock signal, and the deasserted first control signal in response to the deasserted signal and the first clock signal; and
a clock generating circuit configured to generate a second clock signal in response to the first control signal.

17. The apparatus of claim 16, wherein the clock generating circuit comprises:
an inverter; and
a second flip-flop including a clock input coupled to the data output of the first flip-flop, a data input coupled to an output of the inverter, and a data output coupled to an input of the inverter, wherein the data output of the second flip-flop is configured to generate the second clock signal.

18. An apparatus, comprising:
a first logic gate; and
a set of cascaded flip-flops, wherein each of the flip-flops includes first and second data inputs, a data output, a clock input, and a select input, wherein the first data input of one of the set of cascaded flip-flops is coupled to an output of the first logic gate, wherein at least two data outputs of the set of cascaded flip-flops are coupled to at least two inputs of the first logic gate, respectively, wherein the select inputs of the set of cascaded flip-flops are configured to receive a first control signal, and wherein the second data inputs are configured to receive logic values of an initial valid state of a sequence;
wherein the set of cascaded flip-flops are configured to:
  generate distinct valid states of the sequence at their respective data outputs in response to a first clock signal applied to the clock inputs of the set of cascaded flip-flops and the first control signal being deasserted; and
  generate the initial valid state of the sequence at their respective data outputs in response to the first clock signal and the first control signal being asserted;

wherein at least one of the set of cascaded flip-flop comprises:
  a multiplexer circuit configured to output an inverted first logic value at the first data input or an inverted second logic value at the second data input in response to the deasserted or asserted first control signal respectively;
  a first clock-driven inverter configured to output a double-inverted first logic value or a double-inverted second logic value in response to a first edge of the first clock signal;
  an inverter configured to output a triple-inverted first logic value or a triple-inverted second logic value; and
  a second clock-driven inverter configured to output a quadruple-inverted first logic value or a quadruple-inverted second logic value in response to a second edge of the first clock signal.

19. A method, comprising:
generating logic values of a set of distinct valid states of a sequence at a set of nodes in response to a first clock signal, respectively;
determining whether the logic values at the set of nodes corresponds to an invalid state;
controlling at least one of a set of cascaded flip-flops or a multiplexer to change at least one of the logic values corresponding to the invalid state to produce logic values corresponding to one of the valid states at the respective nodes in response to the first clock signal;
detecting logic values at the respective nodes corresponding to an end state of the distinct valid states of the sequence;
generating logic values at the respective nodes corresponding to a programmable state of the distinct valid states of the sequence in response to detecting the logic values at the respective nodes corresponding to the end state of the distinct valid states of the sequence; and
generating a second clock signal in response to detecting the logic values at the respective nodes corresponding to the end state of the distinct valid states of the sequence.

20. The method of claim 19, wherein controlling the at least one of the set of cascaded flip-flops comprises controlling the at least one of the set of cascaded flip-flops by inhibiting the outputting of a logic value associated with the invalid state at a first data input, and outputting another logic value associated with one of the distinct valid states at a second data input in response to first clock signal.

21. The method of claim 19, wherein controlling the multiplexer comprises controlling the multiplexer to inhibit the outputting of a logic value associated with the invalid state at a first input thereof, and allow the outputting of another logic value associated with one of the distinct valid states at a second input thereof.

22. An apparatus, comprising:
means for generating logic values of a set of distinct valid states of a sequence at a set of nodes in response to a first clock signal, respectively;
means for determining whether the logic values at the set of nodes corresponds to an invalid state;
means for controlling at least one of a set of cascaded flip-flops or a multiplexer to change at least one of the logic values corresponding to the invalid state to produce logic values corresponding to one of the valid states at the respective nodes in response to the first clock signal;

means for detecting logic values at the respective nodes corresponding to an end state of the distinct valid states of the sequence;

means for generating logic values at the respective nodes corresponding to a programmable state of the distinct valid states of the sequence in response to the means for detecting the logic values at the respective nodes corresponding to the end state of the distinct valid states of the sequence; and means for generating a second clock signal in response to the means for detecting the logic values at the respective nodes corresponding to the end state of the distinct valid states of the sequence.

23. The apparatus of claim 22, wherein the means for controlling the at least one of the set of cascaded flip-flops comprises means for controlling the at least one of the set of cascaded flip-flops by inhibiting the outputting of a logic value associated with the invalid state at a first data input, and allowing the outputting of another logic value associated with one of the distinct valid states at a second data input in response to first clock signal.

24. The apparatus of claim 22, wherein the means for controlling the multiplexer comprises means for controlling the multiplexer to inhibit the outputting of a logic value associated with the invalid state at a first input thereof, and allow the outputting of another logic value associated with one of the distinct valid states at a second input thereof.

* * * * *